United States Patent [19]

Kaufmann

[11] 4,346,123

[45] Aug. 24, 1982

[54] METHOD OF DEPOSITING HARD WEAR-RESISTANT COATINGS ON SUBSTRATES

[75] Inventor: Helmut Kaufmann, Triesen, Liechtenstein

[73] Assignee: Balzers Aktiengesellschaft, Liechtenstein

[21] Appl. No.: 174,610

[22] Filed: Aug. 1, 1980

[30] Foreign Application Priority Data

Aug. 2, 1979 [CH] Switzerland .................. 7092/79

[51] Int. Cl.³ .................................. C23C 11/14
[52] U.S. Cl. .......................... 427/38; 204/192 N
[58] Field of Search ............... 427/38, 39; 204/192 N

[56] References Cited

U.S. PATENT DOCUMENTS

| | | |
|---|---|---|
| 3,900,592 | 8/1975 | Kennedy et al. ............... 427/39 |
| 3,925,187 | 12/1975 | Bernard ........................... 427/38 |
| 3,988,955 | 11/1976 | Ensel et al. ..................... 427/38 |
| 4,226,082 | 10/1980 | Nishida ........................... 427/38 |

FOREIGN PATENT DOCUMENTS

| | | |
|---|---|---|
| 52-07831 | 1/1977 | Japan ............................... 427/39 |
| 52-07879 | 1/1977 | Japan ............................... 427/39 |

*Primary Examiner*—John H. Newsome
*Attorney, Agent, or Firm*—McGlew and Tuttle

[57] ABSTRACT

A method of depositing hard, wear-resistant coatings on workpieces and utility articles by evaporating a metal such as titanium in a reactive atmosphere. To make the coating hard as far as possible, wear resistant, and less susceptible to oxidation, the deposition is effected in an atmosphere containing nitrogen, oxygen and carbon, with the atomic number proportion of O to C ranging between 0.5 and 1.5. An evaporation by means of a low voltage arc discharge and the use of CO as the residual gas atmosphere are particularly advisable.

4 Claims, 1 Drawing Figure

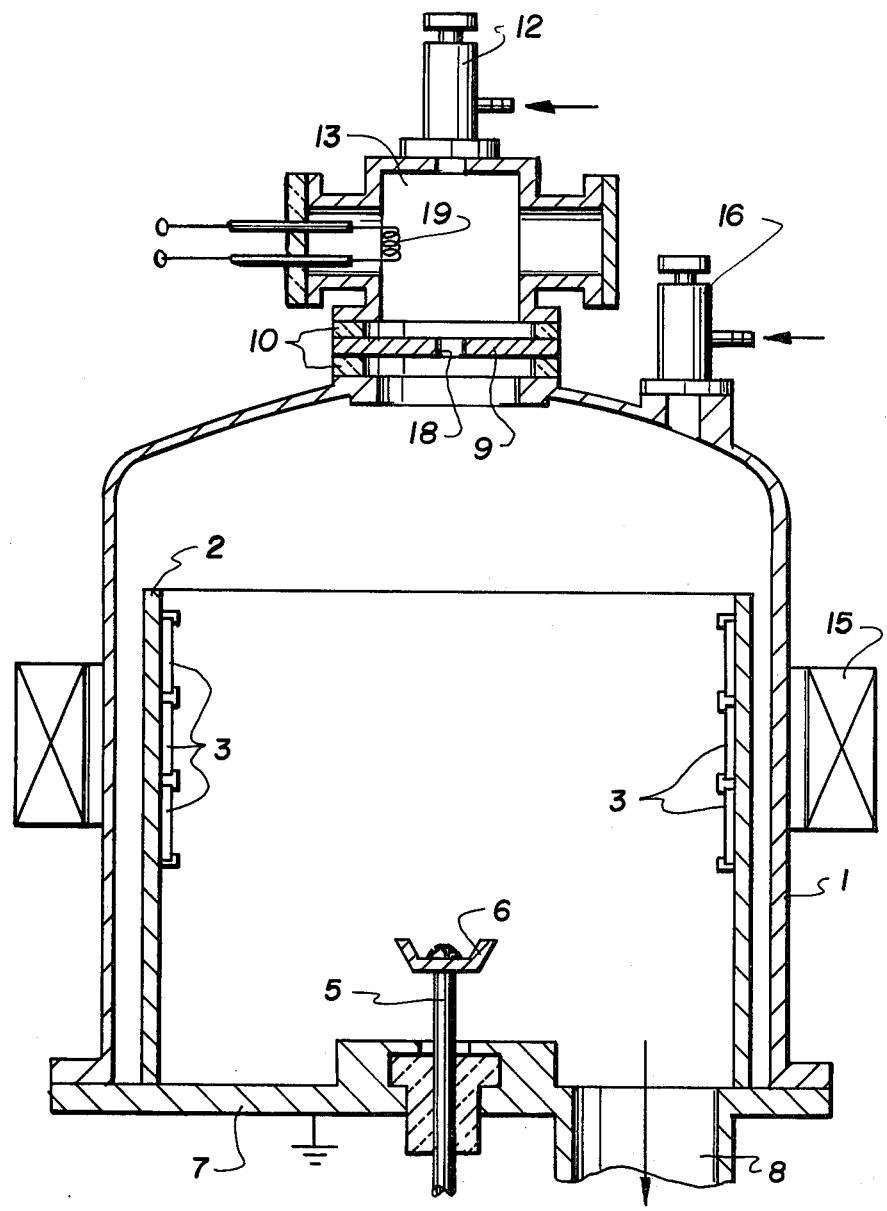

METHOD OF DEPOSITING HARD WEAR-RESISTANT COATINGS ON SUBSTRATES

FIELD AND BACKGROUND OF THE INVENTION

The present invention relates in general, to substrate coating techniques and, in particular, to a method of producing wear-resistant hard layers of hard metal compounds.

It is known to deposit such layers on substrates by vacuum evaporation or cathode sputtering in a reactive atmosphere while at the same time exciting the reaction gas by an electric gas discharge, to stimulate its reactivity. Such a discharge is present in a cathode sputtering process, and with other evaporation methods, it may be produced by means of suitable electrodes in the evaporation chamber. So called "low voltage arc discharge has proven to be particularly satisfactory for vapor deposition, if too strong a heating of the substrates is to be prevented. That is, due to the particularly strong activation of the reactants in the low voltage arc, and adequate reaction is obtained even on cooled substrates, which frequently is not the case with other methods of ion supported reactive deposition.

In particular, the evaporation of titanium in nitrogen, which results in hard, wear-resistant TiN coatings, is known, Due to the brilliance and golden appearance of such castings, they are used, among others, for pieces of jewelry and utility articles. It is further known to produce wear-resistant coatings by evaporating titanium in acetylene or ethylene while evaporating the titanium by means of an electron beam and using additional electric fields for activating the residual gas atmosphere in the evaporation space. This method, however, has a disadvantage in the relatively high temperature (almost 1000° C.) to which the substrates to be coated, are heated. Many materials do not stand such a temperature so that in such cases the mentioned method cannot be applied.

A similar method relates to cathode sputtering of titanium in hydrocarbons with admixed nitrogen, producing a condensate of a crystalline solid solution of titanium carbide and titanium nitride. Such layers are also hard and abrasion-resistant, however, because of their carbide content they are susceptible to oxidation, particularly if during later use they are exposed to high temperatures as in the case of carbide-tipped tools, for example.

SUMMARY OF THE INVENTION

The present invention is directed to a method of producing wear-resistant hard layers, particularly on the basis of hard metal compounds of titanium, zirconium and hafnium, which is reliable and economical and furnishes layers with a substantially reduced susceptibility to oxidation.

The inventive method of depositing hard, wear-resistant coating by precipitating them in a nitrogen containing residual gas atmosphere while simultaneously activating the residual gas by an electric gas discharge, is characterized in that the deposition is effected in a residual gas atmosphere containing nitrogen, oxygen and carbon, with the atomic number proportion of oxygen to carbon ranging between about 0.5 and 1.5. Preferably, carbon monoxide is used as the residual gas component furnishing carbon, and the deposition is effected in an electric low voltage arc discharge, while applying to the substrates to be coated, or to their support, a negative voltage of about 200 volts relative to the wall of the evaporation chamber. Frequently, however, even substantially differing voltages may be used and are expedient. To be able to maintain the low voltage arc also at a relatively low concentration of reactive gases in the evaporation chamber, argon or another neutral or inert gas having a partial pressure ranging between about $5 \times 10^{-4}$ and $3 \times 10^{-3}$ may be added to the residual gas atmosphere.

With the inventive method, layers are produced which are composed of mixed crystals of hard metal compounds, such as titanium carbide, titanium nitride, and titanium oxide, for example, and during the reactive process of deposition, it is only in the course of the deposition proper that the respective hard metal compounds are formed, due to the reaction of the evaporated metal with the residual gas atmosphere. As mentioned, it has been known to produce each of the indicated hard metal compounds individually, through a reactive deposition in a vacuum, thus for example titanium nitride by evaporating metallic titanium in a nitrogen atmosphere, titanium carbide by evaporation in a hydrocarbon atmosphere, and titanium oxide in an oxygen atmosphere. To this end, the presence of the reactive component of the residual gas must be adjusted very accurately and maintained constant if uniform layers are to be obtained, since relatively small upward deviations from the desired value already result in the formation of overly soft layers, due to gas inclusions in the layer. Too low a partial pressure of the reactive component causes a deviation from the desired chemical composition. Except for the mentioned cathode sputtering of titanium in a nitrogen-hydrocarbon mixture, no practical method has been known as of yet, for reactively depositing mixtures (crystalline solid solutions).

The various features of novelty which characterize the invention are pointed out with particularity in the claims annexed to and forming a part of this disclosure. For an understanding of the invention, its operating advantages and specific objects attained by its uses, reference is made to the accompanying drawing and descriptive matter in which preferred embodiments of the invention are illustrated.

BRIEF DESCRIPTION OF THE FIGURE

The only FIGURE of the drawing is a sectional view of an apparatus used in practicing the inventive method.

DESCRIPTION OF THE PREFERRED EMBODIMENTS

In the following, the invention is explained in more detail while considering some examples of its application. The accompanying drawing illustrates an evaporator suitable for carrying out the invention. The FIGURE shows a vacuum chamber 1 having a connection 8 for evacuation and communicating, through an aperture 18 in a wall portion 9, with a hot cathode chamber 13. A hot cathode 19 is accommodated in chamber 13, which is supplied with current from a source (not shown). A crucible 6 for the evaporative metal is placed on the bottom 7 of the evaporation chamber. The crucible may be cooled if necessary. The evaporative chamber accommodates a cylindrical structure 2 for supporting the substrates 3 to be coated. Hot cathode chamber 13 is connected to a gas supply line and the supply of gas is controllable by a valve 12. To produce a magnetic field substantially parallel to the axis of the evaporation chamber, a field coil 15 is provided. The substrates to be coated are secured to that side of supporting structure 2 which faces the evaporative source 6.

To produce coatings in accordance with the invention, lumps of metallic titanium were placed in crucible 6, the chamber was evacuated to $10^{-5}$ millibar and a gas mixture containing argon, nitrogen and carbon monoxide was introduced through valve 12 into chamber 1 and continually evacuated therefrom in a amount to maintain a pressure of $5 \times 10^{-2}$ millibar in the cathode chamber and a total pressure of about $10^{-3}$ millibar in the evaporation chamber. In order to protect the hot cathode, it is also possible to separately introduce argon into the hot cathode chamber, and the reactive gases through a valve 16 into the evaporation chamber, so that during the evaporation, the evaporation chamber is filled predominantly with the required reactive residual gas atmosphere mixed with argon, whose pressure can be adjusted to an optimum by continuous pumping down. The hot cathode, which was put at ground potential, was heated with 1.5 killowatt and then a voltage of $+70$ volt was applied to the anode and a voltage of $-50$ volt, as bias voltage, was applied to the substrates. The anode is formed by the crucible 6 and charged through support 5 by appropriate supply means not shown. By briefly applying the anode voltage to the wall 9 separating hot cathode chamber 13 from evaporation chamber 1, a low voltage arc was struck. The above voltage indications as well as the following ones all refer to differential voltages relative to the chamber wall to which the ground potential is applied. This resulted in a current of 85 A flowing through the hot cathode 19. The current flowing through the anode 6, 5 was 100 A. The difference between the two currents equals the current flowing through the substrates 3. By the current flowing through the anode, i.e. crucible 6, the titanium received therein was melted and evaporated at a rate of about 0.4 grams per minute. Due to the effect of the residual gas, strongly ionized by the low voltage discharge between the hot cathode and the anode, a hard, extremely firmly adhering layer of yellowish color was obtained on the substrates 3 secured to support 2.

In various examples of the application of the method, in each instance with a titanium evaporation rate adjusted to obtain, on a test glass, a deposit of 0.33 micrometers in thickness per minute and with a substrate voltage of $-50$ volts, coatings in various color hues were obtained which all exhibited an extremely high resistance to abrasion.

Example 1: with $P_{N_2} = 2 \times 10^{-4}$ mbar/$P_{CO} = 1 \times 10^{-4}$ mbar Example 2: with $P_{N_2} = 2 \times 10^{-4}$ mbar/$P_{CO} = 2 \times 10^{-4}$ mbar Example 3: with $P_{N_2} = 2.5 \times 10^{-4}$ mbar/$P_{CO} = 3 \times 10^{-4}$ mbar Example 4: with $P_{N_2} = 3 \times 10^{-4}$ mbar/$P_{CO} = 4 \times 10^{-4}$ mbar Example 5: with $P_{N_2} = 3.5 \times 10^{-4}$ mbar/$P_{CO} = 4.5 \times 10^{-4}$ mbar Where $P_{N_2}$ is the partial pressure of nitrogen in the residual gas atmosphere, and $P_{CO}$ is the partial pressure of carbon monoxide.

Coatings of this kind have proven suitable particularly for tools and utility articles. For example, they more than doubled the life of drill bits.

While carrying out the inventive method with residual gas components containing oxygen and carbon, particularly such components or gas mixtures, aside from the carbon monoxide mentioned in the examples, in which the oxygen to carbon ratio expressed in atomic number proportions, is one to one or less, for example ($CH_4 + H_2O$) or ($C_2H_2 + O_2$) and corresponding hydrocarbons adequately mixed with $O_2$ or with compounds containing oxygen, is advisable.

It will be understood that the above indications are not values to be absolutely observed, but values which brought optimum results with the evaporator used in the examples. Depending on the apparatus, the optimum values may vary by up to plus or minus 25%. It may further be advantageous first to apply a higher potential difference between the anode and the substrates, to increase the energy of the particles impinging on the substrate surface and thereby to improve their anchoring and firm adhesion, and then gradually reduce the potential difference during the deposition of further particle layers of the coating.

While producing coatings in accordance with the invention, it was possible throughout to keep temperatures on the substrates below 200° C. frequently even at a substantially lower level. High-gloss coatings were obtained, provided that the surfaces to be coated had been polished in advance. No finishing was necessary. The hardness of all the coatings exceeded 2000 kilograms per millimeters square according to the Vickers hardness test.

Since the reactive residual gas components continue to be consumed in the evaporation process, the reactive gas must continuously or intermittently be resupplied, in order to keep the required partial pressures constant. The hot cathode chamber also must continually be supplied with gas (preferably argon) in an amount sufficient to make the cathode drop distance, depending on the mean free path of the gas molecules, equal in order of magnitude to the distance between hot cathode 19 and separating wall 9. It is advisable to electrically insulate the separating wall 9, for example with insulators 10, in which the aperture connecting the hot cathode chamber with the evaporation chamber is provided, and keep it at a floating potential during the inventive process. Support 5 is also insulated from chamber wall 7 with insulator 4. A positive potential or the ground potential may be applied to the evaporation crucible, and the ground potential or a negative potential is then applied to the cathode. An operation with both the cathode and the evaporative material at a positive potential relative to the ground is also possible. The substrates to be coated are always kept at a negative potential relative to the anode, and they may temporarily (in particular intermittently) even be connected as the cathode of an independent gas discharge.

While specific embodiments of the invention have been shown and described in detail to illustrate the application of the principles of the invention, it will be understood that the invention may be embodied otherwise without departing from such principles.

What is claimed is:

1. A method of depositing a hard wear-resistant coating onto a substrate comprising:
    evaporating a metal in a nitrogen containing residual gas atmosphere to form the coating on the substrate; and simultaneously forming an electric gas discharge in the atmosphere to activate the residual gas; wherein the atmosphere simultaneously contains nitrogen, oxygen and carbon with the atomic number proportion of oxygen to carbon being between about 0.5 to 1.5; and wherein the metal is selected from the group which consists of titanium, zirconium and hafnium.

2. A method according to claim 1, wherein the residual gas atmosphere contains carbon monoxide.

3. A method according to claim 1, including applying a biasing voltage to the substrate, the metal and a cathode to produce a low voltage electric arc discharge in the residual gas atmosphere.

4. A method according to claim 1, including replacing the residual gas atmosphere.

* * * * *